United States Patent [19]

Guilfoyle

[11] Patent Number: 5,278,501
[45] Date of Patent: Jan. 11, 1994

[54] METHOD AND APPARATUS FOR MEASURING FLUID TRANSPORT PROPERTIES THROUGH POROUS MEDIA BY NMR IMAGING

[75] Inventor: David N. Guilfoyle, West Bridgford, England

[73] Assignee: British Technology Group Limited, London, England

[21] Appl. No.: 766,717

[22] Filed: Sep. 27, 1991

[30] Foreign Application Priority Data

Sep. 29, 1990 [GB] United Kingdom ............... 9021257

[51] Int. Cl.⁵ ............................................. G01R 33/20
[52] U.S. Cl. .................................. 324/303; 324/306; 324/300
[58] Field of Search ............... 324/300, 303, 307, 309, 324/306

[56] References Cited

U.S. PATENT DOCUMENTS

| | | | |
|---|---|---|---|
| 4,291,271 | 9/1981 | Lauffer | 324/303 |
| 4,424,487 | 1/1984 | Lauffer | 324/303 |
| 4,718,424 | 1/1988 | Nishimura | . |
| 4,719,423 | 1/1988 | Vinegar et al. | . |
| 4,728,892 | 3/1988 | Vinegar et al. | . |
| 4,769,602 | 9/1988 | Vinegar et al. | 324/303 |
| 4,868,500 | 9/1989 | Baldwin et al. | . |
| 5,023,551 | 6/1991 | Kleinberg et al. | 324/307 |

FOREIGN PATENT DOCUMENTS 0221530 5/1987 European Pat. Off. .
2148013 5/1985 United Kingdom .

OTHER PUBLICATIONS

Ordidge et al, "Real-Time Flow Measurements Using Echo-Planar Imaging", Society of Magnetic Resonance In Medicine, 8th Annual Meeting And Exhibition, vol. 2, Aug. 12, 1989, p. 889.

Primary Examiner—Michael J. Tokar
Assistant Examiner—Raymond Y. Mah
Attorney, Agent, or Firm—Cushman, Darby & Cushman

[57] ABSTRACT

The fluid transport properties of a porous media are determined by NMR imaging showing the fluid transport properties such as fluid velocity, fluid acceleration, fluid jerk, translational self diffusion, sample permeability to fluid transport, etc.

16 Claims, 15 Drawing Sheets

= spin phase scrambling gradient

METHOD AND APPARATUS FOR MEASURING FLUID TRANSPORT PROPERTIES THROUGH POROUS MEDIA BY NMR IMAGING

BACKGROUND OF THE INVENTION

1. Field of the Invention

The present invention relates generally to a method of measuring the flow through porous media and an apparatus therefor, and more particularly to a method and apparatus for measuring the transport properties of a fluid flowing through porous materials using nuclear magnetic resonance (NMR).

2. Description of the Art

The study of flow through porous media provides a means of understanding the process of oil recovery and is therefore of considerable interest to the oil industry. NMR is well suited for the study of the behaviour of liquids in solid porous materials, as found in oil reservoirs for example.

Echo-planar imaging (EPI) (P. Mansfield, Jnl. Phys. C: Solid State Phys. 10 L55 (1977)) is a high speed NMR imaging method which can obtain a full 2D spatially resolved NMR image from one FID. Typically a 128×128 image is acquired in 100 ms. The technique has been applied successfully in a range of clinical studies (M. K. Stehling, A. M. Howseman et al, Radiology 170 257–263 (1989), A. M. Howseman, M. K. Stehling et al, Brit. Jnl. Radiol. 61 822–828 (1988), M. K. Stehling, R. M. Charnley, et al, Brit. Jnl. Radiol. 63 430–437 (1990)) and is especially valuable in parts of the anatomy where there is considerable involuntary motion.

Porous rock samples saturated with water have very large local field inhomogeneities caused by the susceptibility differences of the rock material itself and absorbed water. The largest inhomogeneities occur at the boundaries between liquid and solid where the magnetic susceptibility of the material changes dramatically. The effect of locally induced inhomogeneity is to shorten the effective transverse relaxation time $T_2^*$. This means that the resulting NMR signal is not coherent for a sufficiently long enough time period to perform a standard EPI experiment. This is because standard EPI uses gradient reversals to form a series of gradient echoes which are used to encode spatial information and there is no refocusing mechanism for short $T_2^*$ components.

It is well known that NMR spin echoes produced by application of a 180° radio frequency (RF) pulse rather than a gradient reversal are able to effectively remove local inhomogeneity. A modified EPI sequence can be used for the study of porous media where the gradient reversals are replaced by 180° RF pulses. This means that the technique is limited only by true T2 and not the very short $T_2^*$ caused by large local inhomogeneous field gradients. The modified sequence also maintains the high speed characteristics of EPI with typical exposure times around 100 ms and can be used for real time visualisation of the fluid dynamics inside the porous medium.

In order to achieve flow quantification a spin preparation procedure is required prior to the imaging sequence. Flow encoding procedures for medical applications are well documented (P. R. Moran, R. A. Moran and N. Karsteadt, Radiology, 154 433–411 (1985), P. R. Moran, Mag. Res. Imaging, 1 197–203 (1982)) and currently flow techniques are used to produce very high quality NMR angiograms (projective images) of the major blood vessels in the human body (C. L. Dumoulin, S. P. Souza and H. R. Hart, Mag. Res. Med. 5 238–345 (1987), D. G. Nishimura, Mg. Res. Med. 14 194–201 (1990)). The flow encoding procedure uses a bipolar gradient producing a phase difference between moving and static spins which is linearly dependent on the velocity of the moving spins in the direction of the applied flow encoding gradient.

However a flow encoding procedure for liquids inside porous media must simultaneously overcome the effects of both field inhomogeneity and translational diffusion. Diffusion in the presence of a gradient causes irreversible loss of signal. In the case of liquids in porous media the diffusion process causes a signal attenuation from the applied flow encoding and imaging gradients as well as from the locally induced field gradients. The flow encoding procedure must therefore minimise these effects so as to ensure that there is sufficient signal for imaging after flow preparation.

SUMMARY OF THE INVENTION

It is an object of the present invention to provide an NMR technique which can produce an image showing fluid transport properties within a porous medium which obviates the above effects. By fluid transport properties it is meant for example, fluid velocity, fluid acceleration, fluid jerk, translational self diffusion, sample permeability to fluid transport, etc . . .

The present invention therefore provides an arrangement for measuring fluid transport properties through a porous medium by NMR imaging comprising the following steps:

(a) means for subjecting the flowing spins within a specimen to a flow encoding phase or pre-emphasis phase comprising a sequence of radio frequency pulses consisting of a sequence of 180° RF pulses or equivalent spin inversion pulses sandwiched between a pair of 90° pulses the first of which produces a transverse magnetisation component which forms a series of spin echoes under the action of the 180° RF pulses and in which the second 90° pulse restores the x or y component of spin magnetisation remaining at the end of the sequence, (b) means for simultaneous application between the pair of 90° pulses of a sequence of N bipolar interdigitated velocity encoded gradient pulses.

(c) means for providing a signal spin phase scrambling gradient following the sequences of pulses which signal spin phase scrambling gradient destroys unwanted signal components, the whole sequence being followed by and means for generating a spin interrogation phase following the whole sequence of pulses.

The invention also comprises apparatus for measuring fluid transport properties through a porous medium by NMR imaging including means for carrying out the steps according to the above method. In a further embodiment additional velocity encoded gradient pulses of area A/2 are added to the beginning and end of the above described sequences (a) and (b).

BRIEF DESCRIPTION OF THE DRAWINGS

Embodiments of the present invention will now be described, by way of example with reference to the accompanying drawings, in which.

DETAILED DESCRIPTION OF THE PRESENTLY PREFERRED EXEMPLARY EMBODIMENTS

Imaging Methodology

Figure 1A:
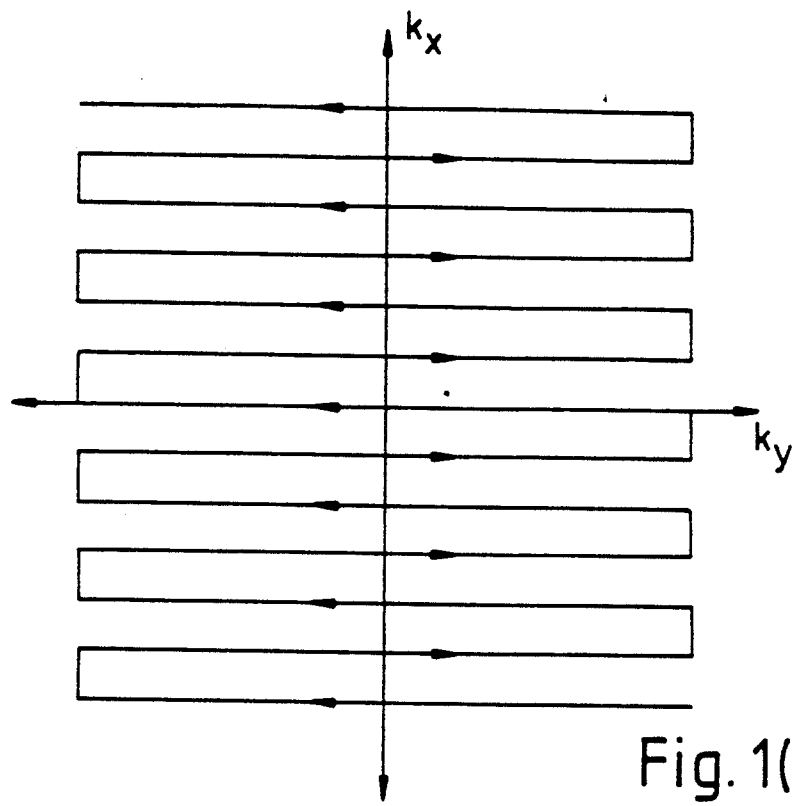
FIG. 1(a) shows coverage of reciprocal lattice space for a conventional EPI sequence and 1(b) shows the timing diagram of the $G_y$ and $G_x$ gradients after slice selection.
Figure 1B:
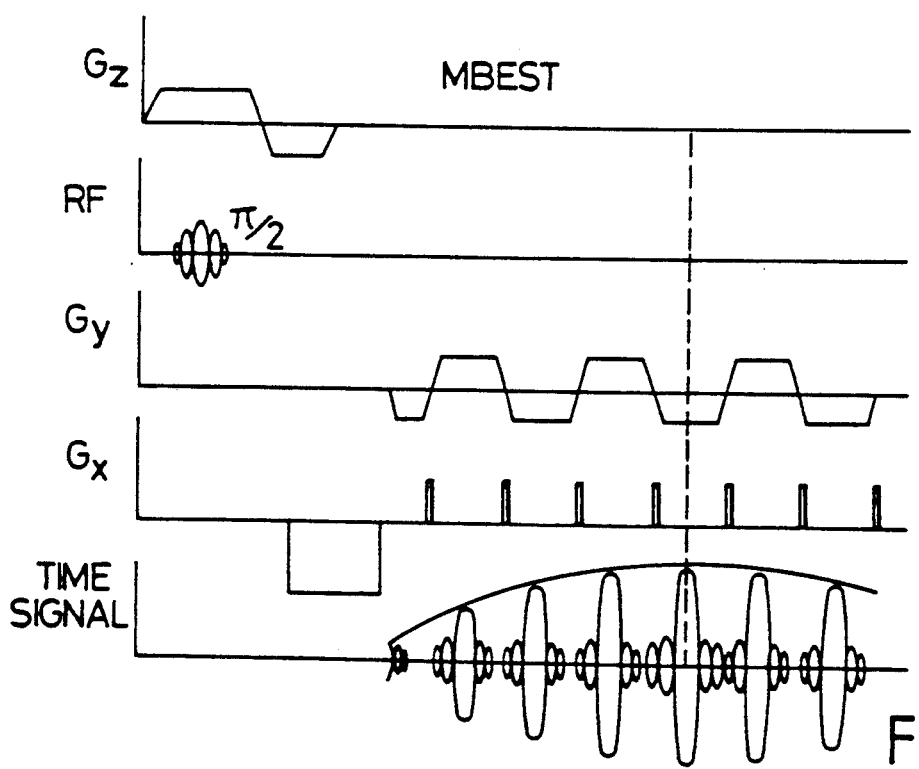

In considering and understanding an NMR image, it is convenient to view the image process from the standpoint of the reciprocal lattice space or k space (P. Mansfield and P. K. Grannell, Jnl. Phys. C: Solid State Phys. 6 L422(1973), S. Ljunggren, Jnl. Mg. Res. 54 338 (1983)) rather than imaging space or real space. This makes the NMR imaging process analogous to optics and the formation of the image can be understood in terms of a Fourier transform (FT) of a diffraction pattern. The base methodology of EPI is to uniformly sample points throughout the reciprocal lattice space in one free induction decay (FID). This is depicted in FIG. 1(a). The raster scan trajectory is achieved by a rapidly oscillating gradient applied along the y direction and a blipped x gradient applied at every y gradient switch. The corresponding gradient timing diagram is shown in FIG. 1(b). This particular version of EPI is called the Modulus Blipped Echo planar Single-pulse Technique (MBEST). Once the data have been acquired a modulus Fourier transform (FT) is applied to give the resulting image data.

Figure 2A:
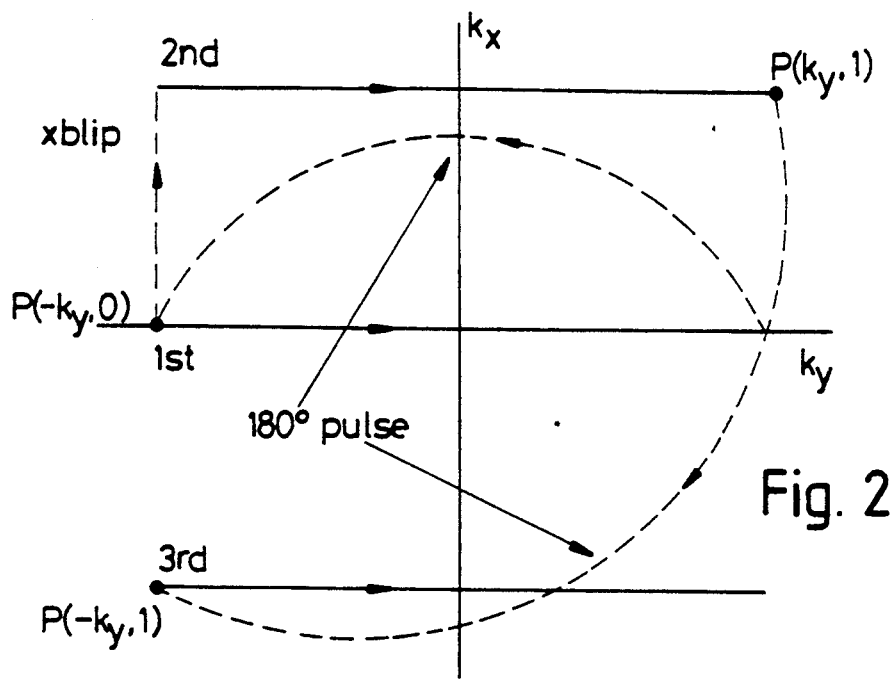
FIG. 2(a) shows coverage of reciprocal lattice space for EPI which uses 180° RF pulses. After the first line of k space is sampled at $k_x=0$, a 180° pulse is applied followed by a $G_x$ blip taking the trajectory along the $k_x$ axis. The second line is then sampled, a further 180° pulse is applied at position $P(k_y,1)$ and then the third line is sampled starting at a position $P(-k_y,-1)$. This procedure is repeated until all the k plane is covered.
Figure 2B:
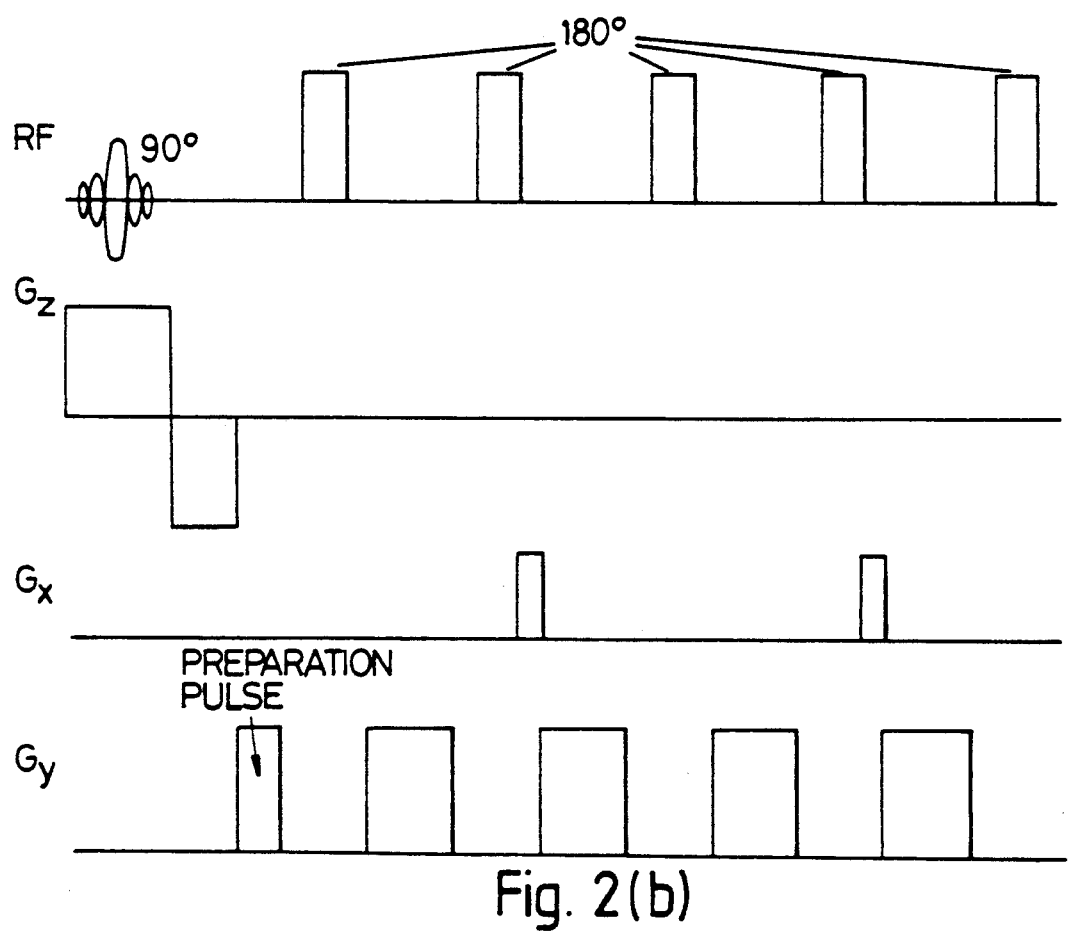
FIG. 2(b) shows the associated timing diagram. An initial $G_y$ preparation pulse is required prior to sampling to make the initial starting point $P(-k_y,0)$.

As mentioned hereinbefore, the applicability of this technique to imaging fluids in porous media is limited by the short T2* caused by local field inhomogeneities. The gradient reversals must be replaced with 180° RF pulses (D. N. Guilfoyle, R. J. Ordidge and P. Mansfield, 8th Annual Meeting of Soc. Mg. Res. in Med, Amsterdam (1989). A schematic representation of this modification is shown in FIG. 2(b). The rapidly oscillating gradient is replaced with a series of unipolar gradient pulses each one centred around a 180° RF pulse. However the reciprocal space trajectory is more complicated than illustrated in FIG. 1(a). The effect of a 180° RF pulse in the k plane is to take the trajectory from a point $P(k_y, k_x)$ to the conjugate point $P(-k_y, -k_x)$. This is shown in FIG. 2(a). The first $G_y$ pulse covers the $k_x=0$ line to take the trajectory to the point $P(k_y, 0)$ A 180° pulse then takes the locus back to the point $P(-k_y, 0)$. A $G_x$ blip then increments the point up the $k_x$ to sample the next line $k_x=1$. At the point $P(k_y,1)$ a second 180° is applied to take the trajectory to the conjugate point $P(-k_y, -1)$. The procedure is repeated with further increments of $k_x$ until the entire k-plane is sampled. In this way it is seen that a $G_x$ blip is required only every alternate $G_y$ pulse. The data then have to be reordered so that the phase accumulation along the $k_x$ axis is continuous thus allowing a one dimensional modulus FT.

For medical applications RF power deposition in the patient may be too high with this technique. Power may be reduced by having a combination of gradient switches and 180° pulses. This approach would overcome susceptibility problems, depending on the number of gradient switches in between each 180° pulse, while reducing the RF power duty cycle. However for geological samples power deposition is not an important consideration.

Flow Encoding Strategy

The sensitivity of NMR to flow was recognised over 30 years ago (E. L. Hahn, Phys. Rev. 80, 580-594 (1950), G. Suryan, Proc. Indian Acad. Sci. 33 107 (1951)). However it has only recently been possible to obtain spatially localised flow measurements using the principles of NMR imaging (P. R. Moran, R. A. Moran and N. Karsteadt, Radiology, 154 433-411 (1985), H. van As, J. M. Kleijn, Delager P. A. and T. J. Schaafsma, Jnl. Mag. Res. 61 511-517 (1985)).

For moving spins in a linear magnetic field gradient $G = iG_x + jG_y + kG_z$ the accumulated spin phase $\alpha(t)$ due to motion may be written as $$\alpha(t) = k \cdot r \qquad (1)$$

The reciprocal lattice vector k is defined as $$k = \gamma_0 \int G(t')dt' = ik_x + jk_y + kk_z \qquad (2)$$

The spin position vector r (t) is given by $$r(t) = r_0 + r't + \tfrac{1}{2}r''t^2 + \ldots \qquad (3)$$

where the primes denote the first, second, etc. time derivatives.

If $r = ix$, for example we may write for equation (3)

$$x(t) = ix_0 + iv_x ia_x t^2/2! + ij_x t^3/3! + \ldots \qquad (4)$$

where $x_0$ is the initial or static spin displacement, $v_x$ is the x-component of the velocity vector, $a_x$ is the x-component of the acceleration vector $j_x$ is the x-component of the jerk vector, etc., and $\gamma$ is the gyromagnetic ratio.

Figure 3:
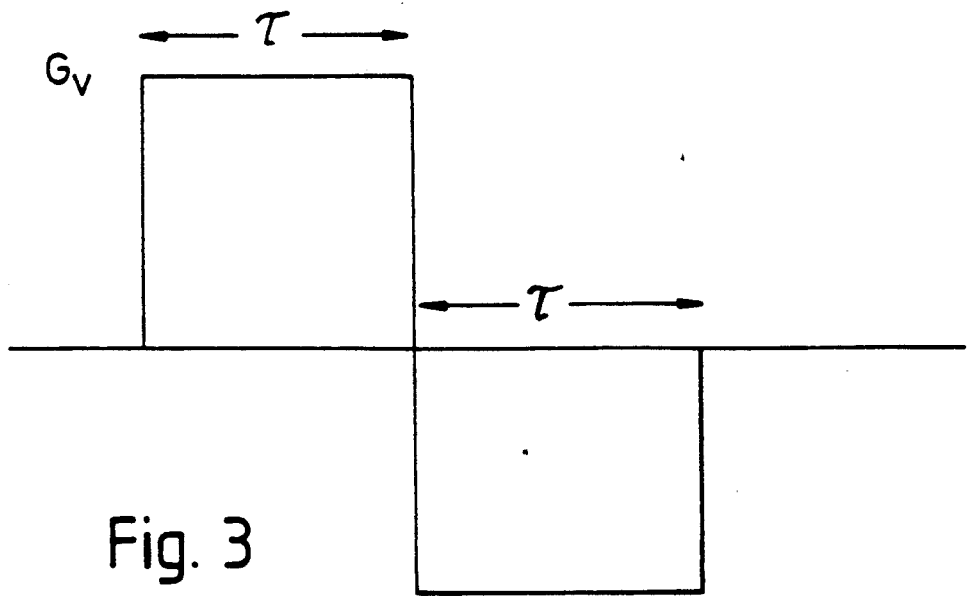
FIG. 3 shows a standard bipolar phase encoding gradient. At the end of the sequence the static spins have refocused and the moving spins have a phase evolution $\alpha = \gamma G_y V \tau^2$ (equation 6)

Consider a bipolar gradient, FIG. 3, applied along the direction of motion for a total time $2\tau$. The resulting phase accumulation including the first two terms of equation 3, ie. both static spins and spins moving with velocity v will be $$\alpha = \gamma \int_0^{2\tau} G_y(t)(z + vt)dt \qquad (5)$$

where z is the position of the spins along the direction of the applied gradient $G_y$, v the velocity and $\gamma$ the gyromagnetic ratio. For constant $G_y$ equation (1) evaluates to $$\alpha = -\gamma G_y v \tau^2 \qquad (6)$$

This means that the phase of the transverse magnetisation is independent of position and linearly dependent on velocity. In other words all static spins will be refocused and all moving spins will have a linear phase dependence on velocity. This bipolar gradient sequence is a simple means of velocity encoding (P. R. Moran, Mag. Res. Imaging, No. 1, pages 197-203 (1982))and provides a basis for distinguishing flowing from stationary material.

The flow encoding procedure currently used with standard EPI for medical imaging uses two unipolar gradient pulses centered around a 180° pulse instead of a bipolar gradient. The procedure, described elsewhere (R. J. Ordidge, D. N. Guilfoyle, P. Gibbs and P. Mansfield, 8th Annual Meeting of Soc. Mag. Res. in Med., Amsterdam (1989), D. N. Guilfoyle, P. Gibbs, R. J. Ordidge and P. Mansfield, Magn. Reson. Med., 18,1 (1991), consists of a $90°_x - G_y(\tau) - 180°_x - G_y(\tau) - 90°_{x,y}$ pulse train prior to the standard EPI experiment. For flow encoding in porous media, this technique may be applied so long as $\tau$ is less than 1 ms, otherwise translational diffusion will cause severe attenuation of the signal. This attenuation factor is given by A. Abragrahm, The Principles of Nuclear Magnetism, OUP, (1961), as $$\exp(-\gamma G_d^2 \tau^3 D) \quad (7)$$

where the effective gradient $G_d$ includes local induced gradients and D is the diffusion coefficient. The $\tau^3$ dependence means that the gradient pulse must be as short as possible in order to minimise this attenuation. However short ] provides little sensitivity to flow (equation 6), i.e. the phase change will be small. For example the velocity range 0 to 1 mm/sec would require a gradient strength of 6 T/m for $\tau=1$ m sec to achieve a phase shift of $\pi/2$. Signal attenuation would be very large through the diffusion term, equation (7).

A way around this problem would be to cyclically repeat the pair of unipolar pulses to achieve a linear accumulation of phase (K. J. Packer, Jnl. Mol. Phys. 17, no. 4, 355–368, (1969)). The 180° pulse is applied at the spin echo peak rather than between echoes as in a Carr-Purcell sequence. This produces a linear accumulation of phase from the moving spins dependent on the number of cycles applied and the $\tau$ value. In the Carr-Purcell sequence, even echo rephasing (H. Carr and E. M. Purcell, Phys. Rev. No. 94, pages 630–638 (1954)) takes place, where the accumulated phase of the moving spins returns to zero on every even echo.

Figure 5A:
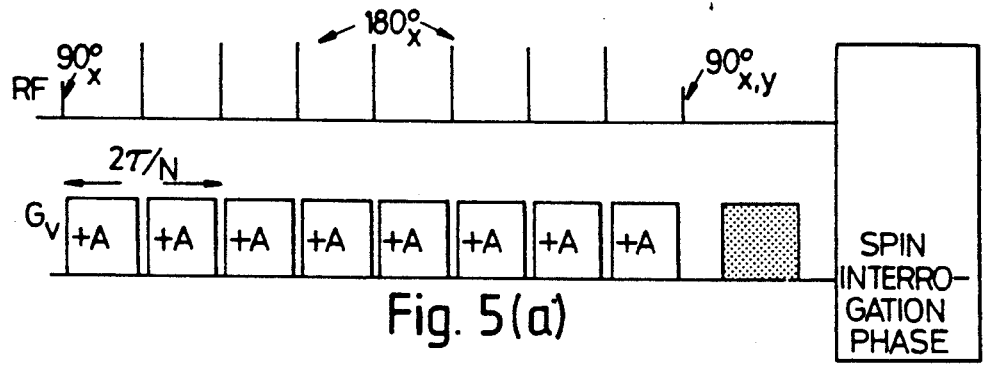
FIG. 5(a) shows a modified flow encoding sequence consisting of short gradient pulses of duration $\tau/N$. The spin echo peak coincides with the 180° pulses. Each $2\tau/N$ cycle produces a phase shift of $\gamma G_y V(\tau^2/N)^2$. At the end of the sequence the total accumulated phase is $\gamma G_y V \tau^2/N$. In order to produce the same phase shift for a constant gradient pulse of length $\tau$, the cycle must be repeated $N^2$ times yielding a total velocity encoding sequence duration of $2N\tau$.

Consider a cycle time $2\tau/N$ as shown in FIG. 5(a). In order to achieve the same velocity sensitivity as a single cycle of period $2\tau$, the cycle must be repeated $N^2$ times. This means that the sequence of FIG. 5(a) will have a total duration of $2N\tau$. This approach is therefore a less efficient flow encoding procedure. (We assume the RF pulses are of negligible width, although in practice this has to be taken into account).

Figure 5B:
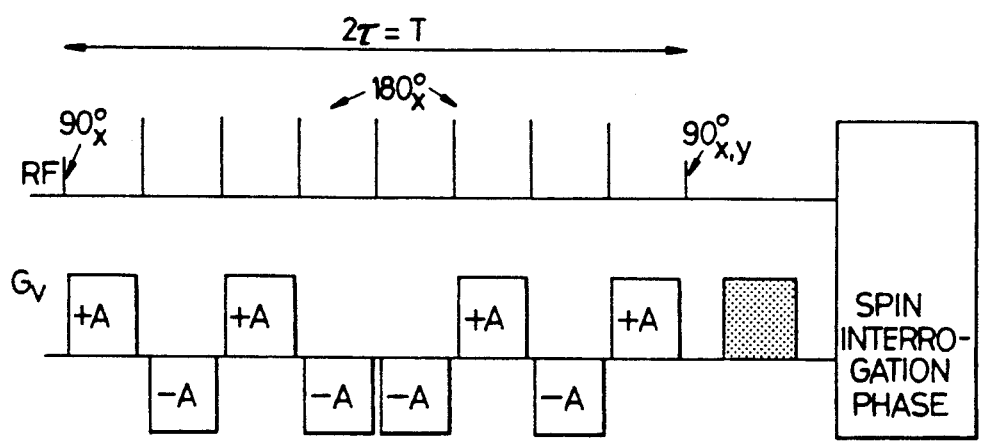
FIG. 5(b) illustrates in this sequence that the polarity of alternate gradient pulses is reversed up to the halfway point when the sequence of gradient pulses is reflected about the central time point. The total phase accumulation of moving spins is the same as a single cycle of duration $2\tau$; (See FIG. 3).
Figure 6:
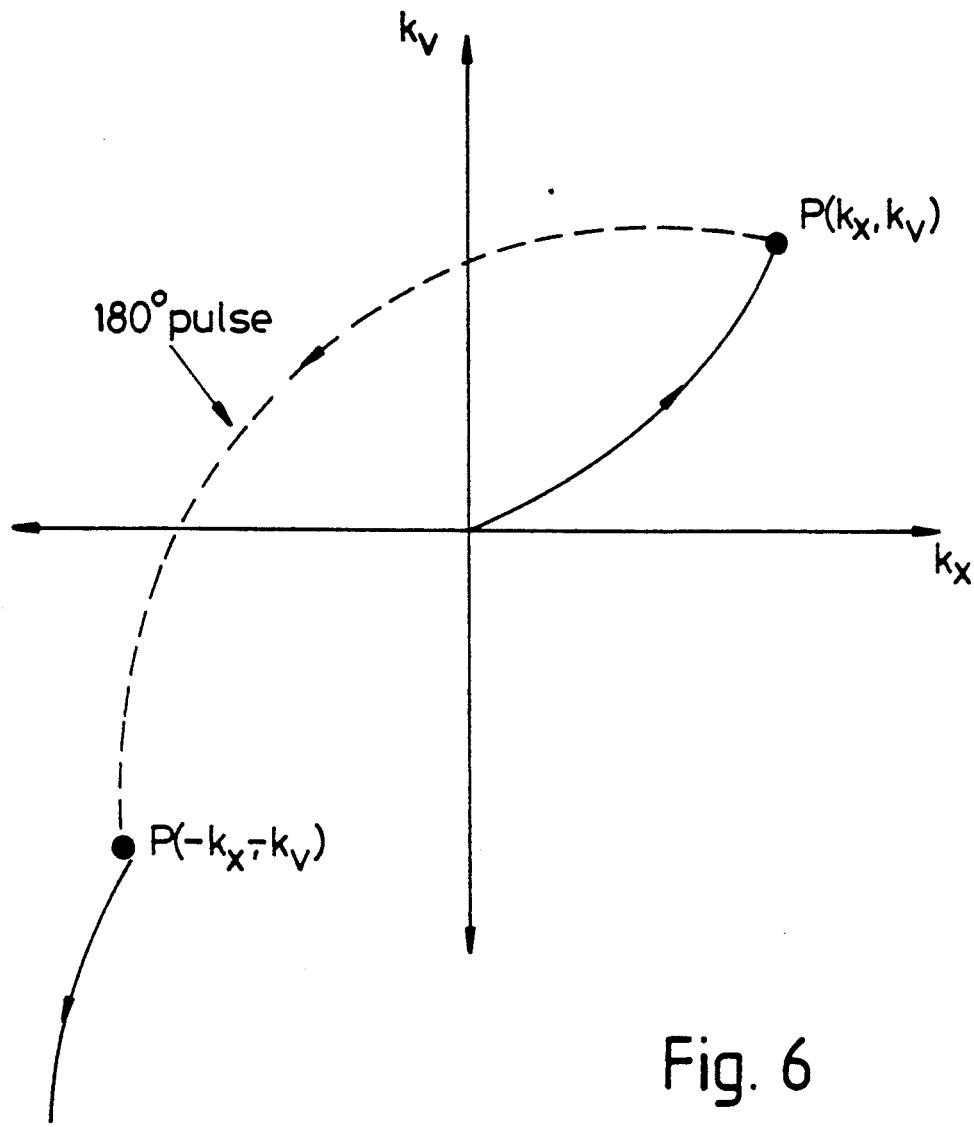
FIG. 6 shows the k-space trajectory during the velocity encoding procedure of FIGS. 5(b) and 5(c)

The sequence shown in FIG. 5(b) has the sign of alternate gradient pulses reversed. The effect of this is a continual dephasing of the spin system as if a constant gradient is applied, even though a 80° RF pulse is also present. This can be interpreted in terms of a k trajectory map where $k=ik_x+jk_y$ where $k_x$ and $k_y$ are the vector component amplitudes of the static and moving spins respectively. The initial trajectory is parabolic, arising from the $\tau^2$ dependence described in equation 6. Once a 180° pulse is applied the locus of the trajectory switches to its conjugate point and continues to dephase along the parabolic path as if a constant negative gradient has been applied the whole time. (This is shown schematically in FIG. 6).

At the halfway point the gradient sequence is reflected in time in a complementary sequence which unwinds the spin phase as if a continuous gradient is applied of opposite polarity to the initial pseudo constant gradient. As a result the static spins are refocused at the end of the sequence and the moving spins have an accumulated phase o proportional to $\tau^2$. This produces exactly the same sensitivity to flow as the single cycle of duration $2\tau$.

The above described method minimises the attenuation due to diffusion by using short gradient pulses. The local magnetic field gradients will cause an additional phase shift of the moving spins which can be taken into account. If it is required to remove this contribution then the phase shift caused by the local gradients must be removed leaving only a phase shift caused by the applied gradients. The sequence shown in FIG. 5(c) achieves this objective. For the local gradients the sequence is a Carr-Purcell sequence. This provides an even echo rephasing of the magnetisation for both static and moving spins. However because the sign of the applied gradient is alternated there is a net phase accumulation caused by the applied gradient on the moving spins but not the static spins. This is equivalent to a simple single cycle velocity encoding experiment of duration $2\tau$. The condition for effective removal of the local gradient is that the signal is re-stored for subsequent imaging on an even echo peak.

As in the single cycle experiment, a 90° pulse of x or y phase can be applied to tip either the cosine or sine component along the longitudinal axis for imaging by the 80° RF pulse version of EPI described hereinbefore. The remaining unwanted spin magnetisation component is destroyed by the spin phase scrambling gradient.

Figure 4:
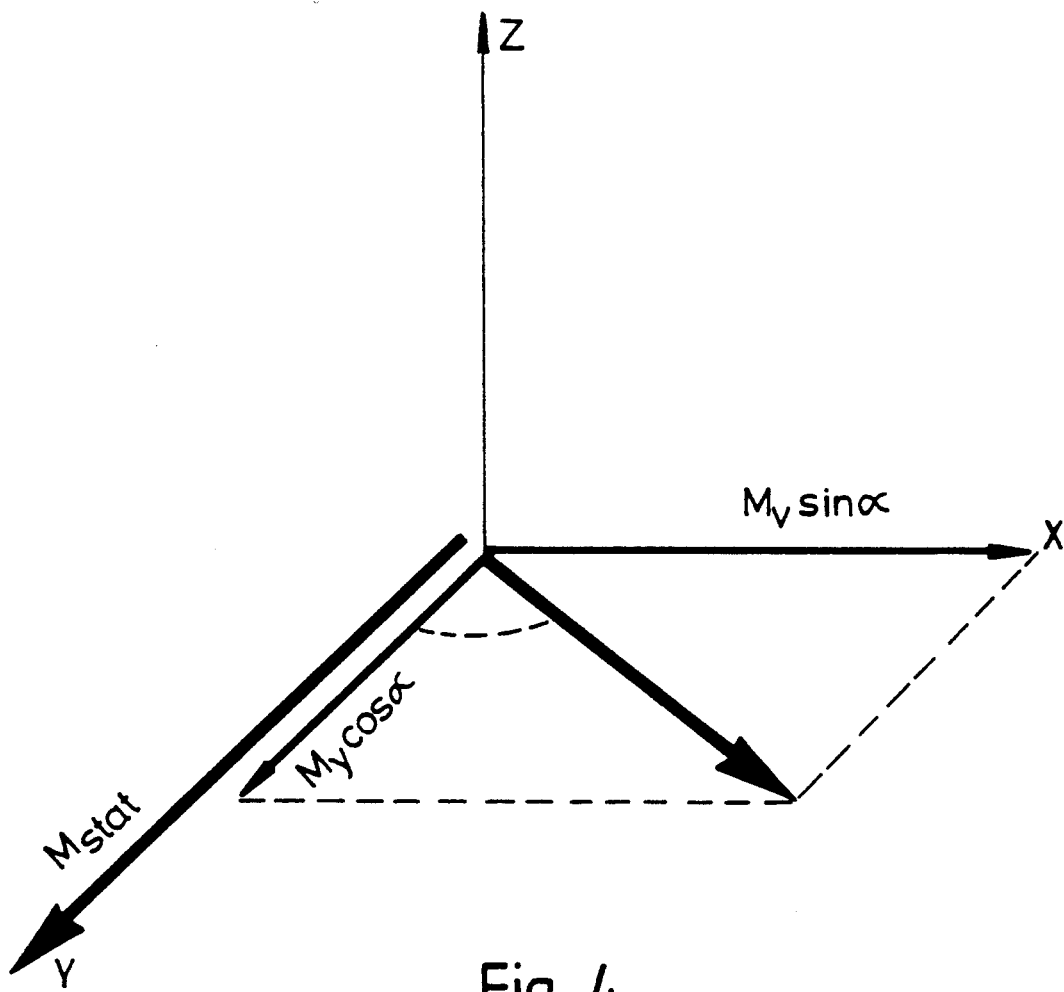
FIG. 4 shows the position of the magnetisation vectors at the end of the flow encoding sequence and immediately prior to the last 90° x,y re-store pulse. If the re-store pulse is a $90°_x$ pulse then $M_{stat}+M_y\cos\alpha$ is re-stored along the longitudinal axis. If the re-store pulse is a $90°_y$ pulse, then $M_y\sin\alpha$ is re-stored. The re-stored component is then used for the subsequent imaging experiment. The remaining unwanted component is destroyed by the spin phase scrambling gradient.

The position of the magnetisation immediately prior to the last $90°_{x,y}$ pulse is depicted in FIG. 4. The static magnetisation, denoted by $M_{stat}$, is refocused along y, but the moving magnetisation, $M_\nu$, has a phase shift governed by equation (6). A $90°_x$ pulse re-stores the $M_{stat}+M_\nu\cos\alpha$ component along the main field axis, leaving the $\sin\alpha$ component to be destroyed by the spin phase scrambling gradient. If a $90°_y$ pulse is applied instead, the $M_\nu\sin\alpha$ component is re-stored for subsequent imaging and the $M_{stat}+M_\nu\cos\alpha$ component is destroyed. This phase change gives a direct visualisation of the moving components of the image, weighted with a sine function.

In order to evaluate the velocity v, the sine image is divided by the cosine image to give a $\tan\alpha$ map which can be converted to a velocity map. If the sign of the velocity is required then the phase of the sine and cosine weighted images must be examined to determine in which quadrant $\alpha$ lies. It is assumed that any given pixel contains either moving spins or static spins but not both.

Six combinations of experiments are required to measure the three components of velocity, i.e. two experiments for each of the three spatial axes x, y, z. If there is no object movement, then real time flow measurement is possible. This is achieved by initially performing both sine weighted and cosine weighted experiments to calculate the initial signal magnitude and flow rate, then the sine weighted experiment can be applied in real time for continual quantative monitoring of flow in the direction of the applied flow encoding gradient. The gradient pulses and $\tau$ can be made short to minimise the diffusion attenuation term.

Figure 5C:
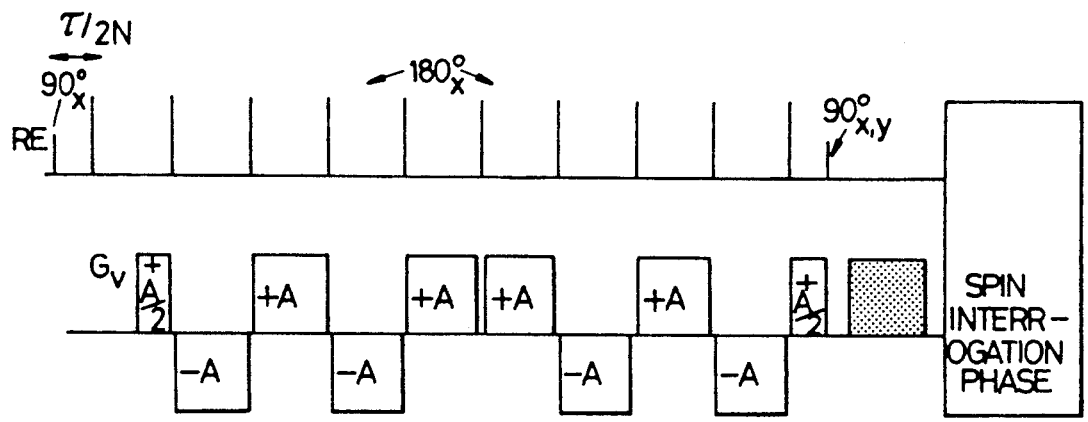
FIG. 5(c) is a further modification of FIG. 5(b) in which additional pulse gradients $G_y$ of duration $\tau/2N$ are applied at each end of the sequence. This has the effect of removing accumulated phase shifts arising from the locally induced field gradients for both static and moving spins.

In an alternative embodiment the non-selective 180° pulses may be replaced by selective 180° pulses in FIG. 5c in which can be either slice selective or frequency selective. The advantage of frequency selective pulses is the ability to flow encode a single phase in a multi fluid system. There are several possibilities to achieve this goal. The initial excitation (90 deg) pulse could be frequency selective to one phase leaving the flow encoding procedure to act on only these spins. The frequency selection can then be changed to repeat the flow encoding experiment on the remaining phase.

Another option is to use a frequency selection procedure described by Volk et al (Jnl Mag Res, 71,1 168–170, 1987). In this procedure the bandwidth of the RF excitation pulse is set equal to that of the frequency difference between the two species of interest. The frequency of the refocussing 180 deg RF pulse is changed from that of the carrier. A consequence of this is that one species is excited in two different slices by the 90 deg and 180 deg pulses, whereas the species of interest is excited by both pulses in the same plane. This could be incorporated into the slice selection of flow encoding which would require very little change to the existing method. The main disadvantage of this approach is that it is only really applicable at high field strengths, where the frequency difference of the resonances is sufficiently large.

In summary of this alternative embodiment then any saturation or frequency selective technique may be included into the flow encoding method described by the current patent so that velocity maps of a single phase may be extracted from a multi phase model.

Higher Orders of Motion

Figure 17:
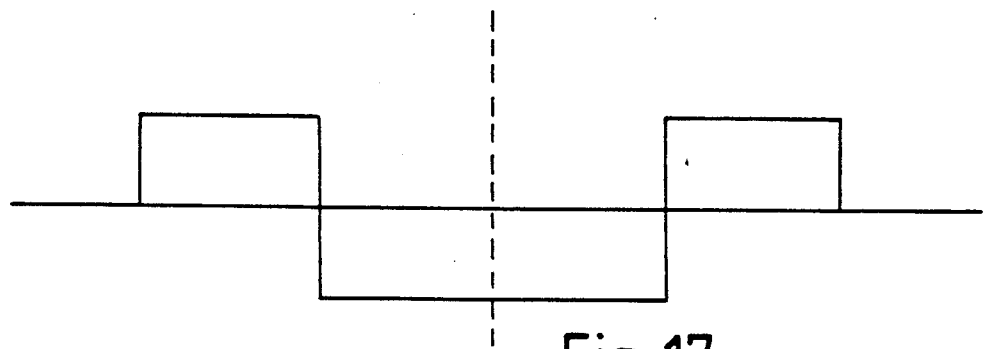
FIG. 17 shows a back to back bipolar gradient, for rephasing of components due to position and velocity.

So far we have considered a particular sequence capable of encoding flow velocity v. However, from Equation 4 there are other interesting parameters associated with movements which are also amenable to measurement when intrinsic magnetic field gradients and diffusion are present. For example acceleration a can be measured by using 2 encoding sequences of FIG. 5(b) in reflection symmetry ie, a pair of back to back bipolar gradients as shown in FIG. 17. This arrangement refocuses phase accumulation due to $x_o$ and v but leaves a net phase accumulation due to a. Higher order terms may be similarly isolated in more complicated sequences. By a suitable re-arrangement of this sequence, the phase accumulations due to $x_o$ and a could be cancelled leaving a net phase shift due to v. Indeed any two components may be re-focussed leaving a net phase shift due to the third remaining component.

Figure 18:
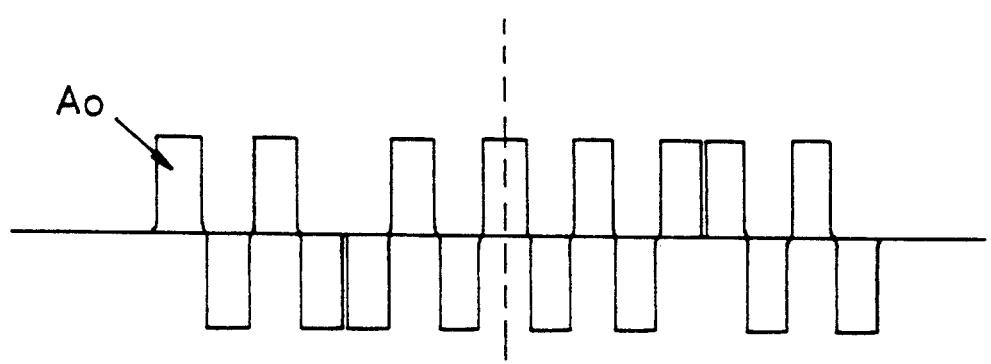
FIG. 18 shows a modification of the gradient waveform of FIG. 17, where each lobe is broken down into constituent pulses sandwiched between two 90° pulses. A 180° RF pulse is applied inbetween each separate gradient pulse but for simplicity the RF pulses are not shown. This sequence is used for acceleration encoding and must be repeated with no applied gradients. The local gradient contribution can then be evaluated and subtracted to leave a phase shift due only to acceleration in the presence of the applied gradient.
Figure 19:
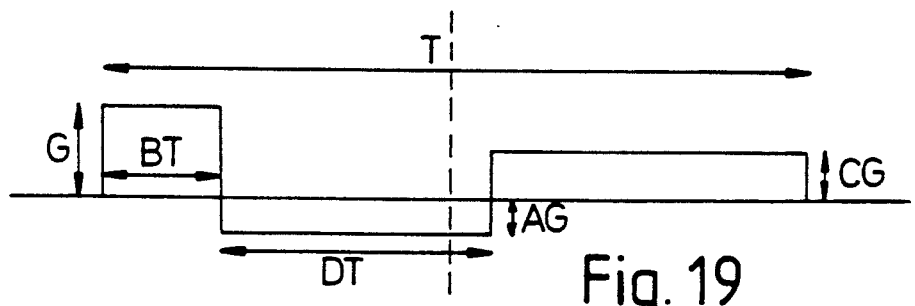
FIG. 19 shows a generalisation of the back to back bipolar gradient waveform in, FIG. 17 to refocus any two parameters leaving a net phase shift for the remaining parameter.
Figure 20:
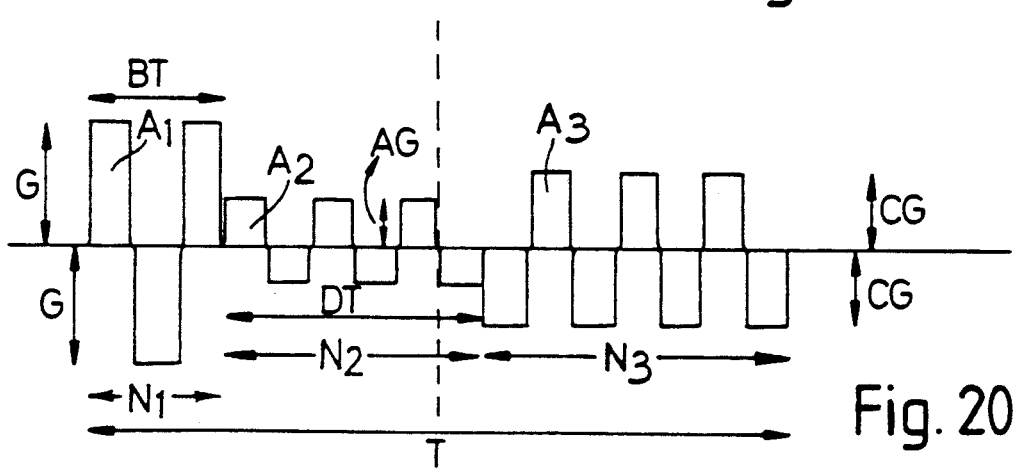
FIG. 20 illustrates FIG. 19 when it has been broken down into its constituent pulses for rephasing of components due to acceleration and position. A 180° RF pulse is applied inbetween each separate gradient pulse but for simplicity the RF pulses are not shown. This sequence is used for velocity encoding and must be repeated with no applied gradients. The local gradient contribution can then be evaluated and subtracted to leave a phase shift due only to acceleration in the presence of the applied gradient.

Breaking FIG. 17 down into its constituent pulses minimises diffusion effects and overcome inhomogeneities caused by local field gradients etc in the same way as the present invention. This back to back bipolar sequence would then be as depicted in FIG. 18: However in this sequence there is an additional phase shift caused by the local gradients from the velocity and acceleration terms in equation 4. If the experiment is repeated with no applied gradients then the resulting phase shift will only consist of contributions from the local gradients. Subtraction of the resulting phase data will leave a phase shift caused only by the applied gradient and acceleration term. The above sequence can be generalised as shown in FIG. 19 so that phase dependence on any combination of two parameters can be eliminated leaving only a linear dependence on the remaining parameter. For example to remove the phase dependence on acceleration and position A, B, C, D would have the following values: A = −1, b = 14/8, C = 1, D = 1/2. This can then be broken into its constituent pulses as shown below in FIG. 20 in order to minimise diffusion and overcome local field inhomogeneities. Again there is an additional phase shift due to local gradients and the velocity and acceleration terms in equation 4. Repeating the experiment with no applied gradients will leave only the phase shift from the local gradients. Subtraction of the two data sets will also eliminate the contribution from the local gradients leaving only a net phase shift caused by the applied gradient and the velocity terms of equation 4. FIG. 18 is used to encode acceleration in the presence of velocity and FIG. 20 is used to encode velocity in the presence of acceleration.

Basically any required encoding sequence can be achieved by breaking each gradient lobe into small alternating gradient pulses centred around 180° RF pulses.

In the present invention, short 80° RF pulses are used. However two 90° RF pulses or a combination of low angle pulses could also be used to produce a 180° spin inversion pulse. Other adiabatic inversion pulses could be used instead of specific 180° RF pulses. In certain circumstances softer 180° RF pulses could be used in the form of selective 180° pulses.

The gradient pulses indicated are rectangular. However these may be arbitrarily shaped for convenience of generation so long as the areas under each pulse waveform are equal.

Experimental Results

Figure 7A:
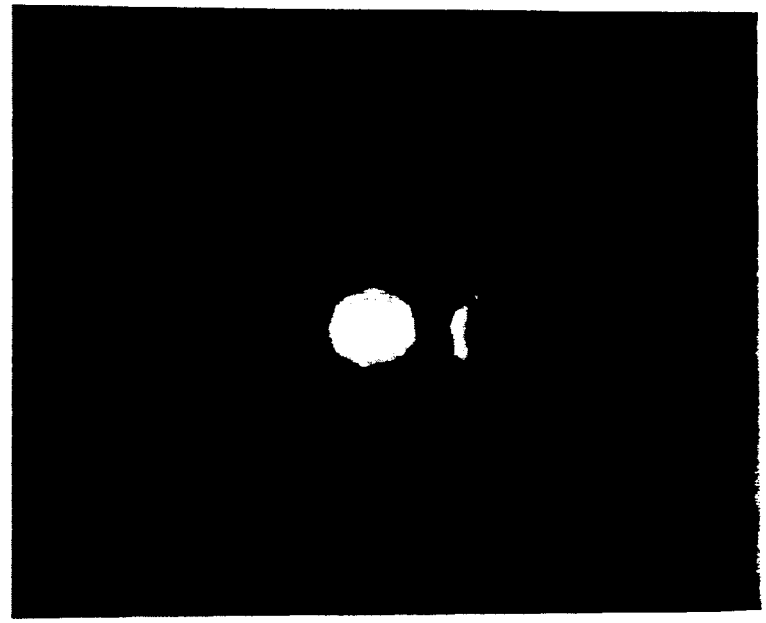
FIG. 7 shows cross-sectional images of a test tube of water (internal diameter 2.1 cm), and a pipe containing water in laminar flow. The pipe has an internal diameter of 2.5 cm.
(a) Cosine weighted flow encoded image. The static tube (left) makes a full contribution in this image.
(b) Sine weighted image. The static tube makes no contribution in this image. The image resolution is 1 mm with a slice thickness of 1 cm. The images are acquired with the flow encoding sequence of FIG. 5(b) followed by the 180° RF pulse EPI technique.
Figure 7B:
Figure 8:
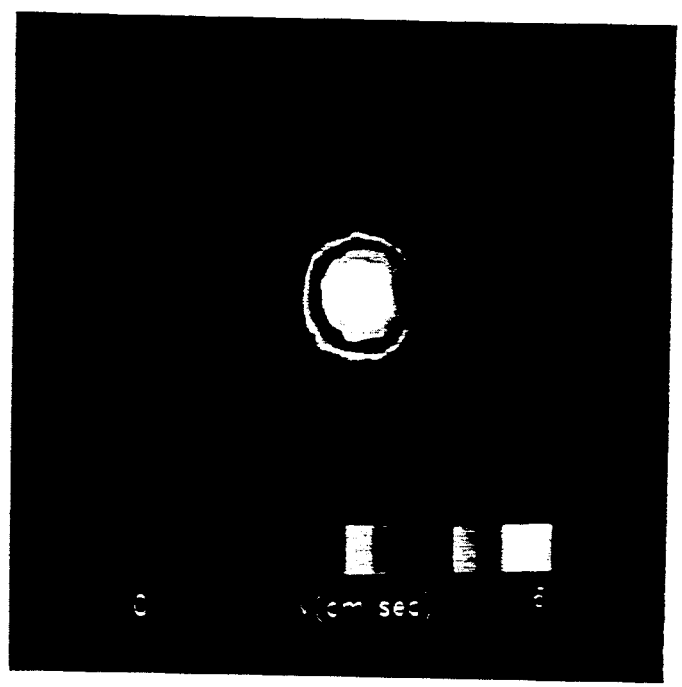
FIG. 8 shows a velocity map of the data of FIG. 7. The sine image is divided by the cosine image and the resulting tan $\alpha$ is converted to a velocity map using equation 6. The concentric contours indicate a parabolic distribution as expected for laminar flow.

Using the flow encoding technique as shown in FIG. 5(c) along with the 180° RF pulse version of EPI, we have obtained flow maps in several sandstones. To test the sequence a cylindrical pipe of internal diameter 2.5 cm, containing water in laminar flow, was imaged to check that the resulting flow map was parabolic. FIGS. 7(a) and 7(b) show the cosine weighted and sine weighted images using this flow encoding method of 5(b). The image plane is perpendicular to the direction of flow. A reference test tube of water was placed next to the cylindrical pipe of diameter 2.1 cm. This tube makes a full contribution in the cosine experiment and zero contribution in the sine experiment, as expected for static spins. The flow rate through the pipe was 14.5 m liter s$^{-1}$ corresponding to an average velocity of 2.95 cm/s. An appropriate algorithm is used to divide the sine weighted image by the cosine weighted image and convert the resulting tan $\alpha$ image into a velocity image using equation 6. The flow encoding gradient strength used was 3.89 mT/m with an effective $\tau$ of 6 ms. The resulting velocity map is shown in FIG. 8. This shows a parabolic profile as indicated by the circular contours on the image. The peak velocity at the center of the tube is 5.92 cm/s which is in good agreement with the value of 5.90 cm/s obtained from the known flow rate and internal diameter.

Two sandstone samples were used for flow measurements by this technique. The first sample was a Bentheimer quartz sandstone which is known to have a very uniform distribution of pore size and serves as a good model for initial tests. The second sample is a Ninian reservoir core sample which is known to have a very heterogeneous distribution of pore size. Both samples were sealed in resin and distilled water was pumped through using a Gilson 303 pump for a controlled flow rate through the samples. Both samples have a porosity of 25 percent. The Bentheimer sample was a cylindrical plug 4.9 cm in diameter and 18 cm long. The Ninian sample, also a cylindrical plug, had a diameter of 3.7 cm and a length of 7.5 cm.

Figure 9A:
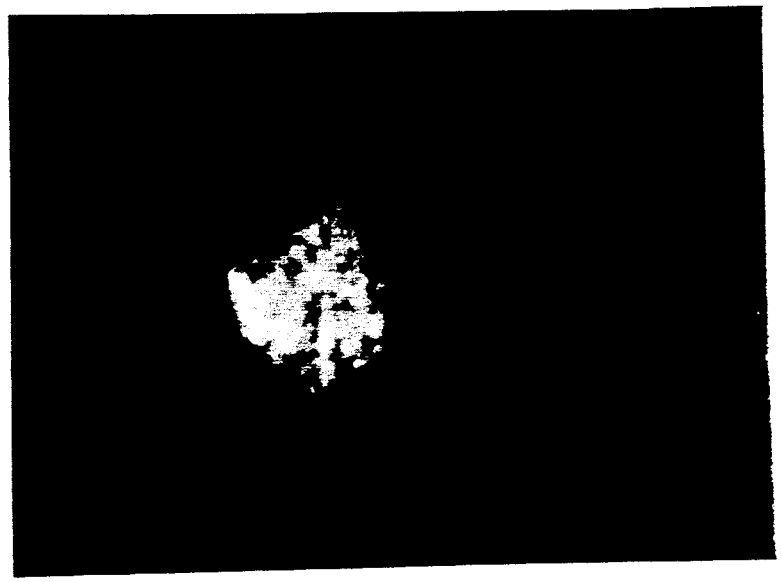
FIG. 9 shows cross-sectional flow encoded images of water flow through a Bentheimer sandstone sample. (a) Cosine weighted image (b) sine weighted image. The image resolution is 1 mm with a slice thickness of 1 cm. Each image represents a 16 shot average.
Figure 9B:
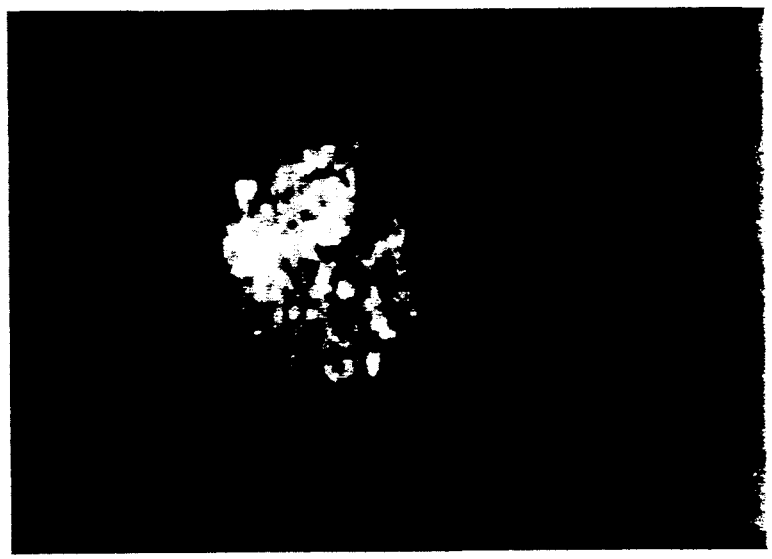
Figure 10:
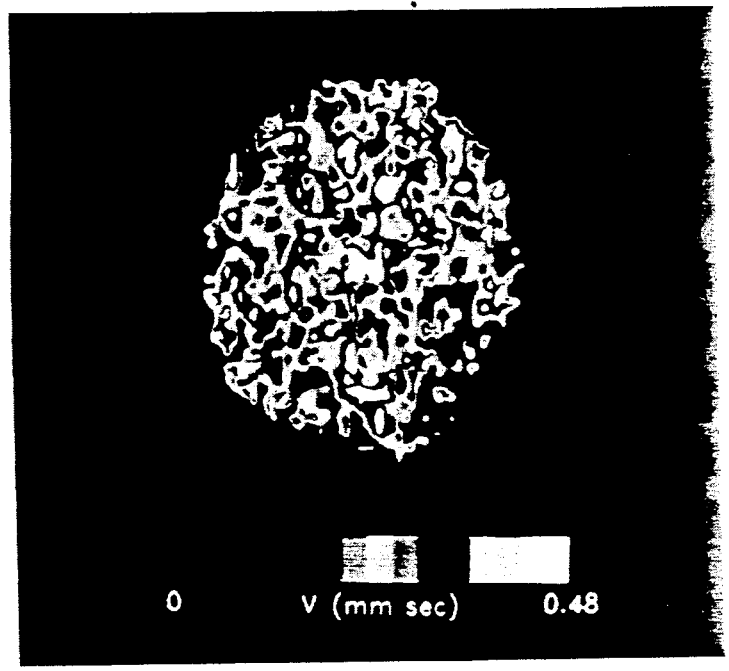
FIG. 10 shows a velocity map of the data in FIG. 9. The sine weighted image is divided by the cosine weighted image and the resulting tan $\alpha$ is converted to a velocity map using equation 2. $M_{stat}$ is assumed zero for all pixels.
Figure 11A:
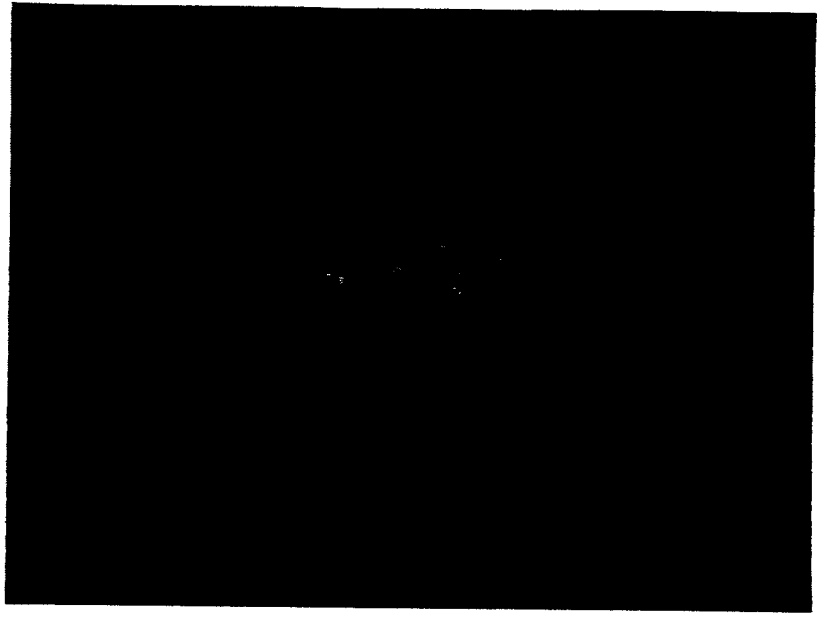
FIG. 11 shows flow encoded images of flowing water through a Bentheimer sandstone sample taken with the image plane parallel to the direction of flow (a coronal section). The flow encoding is also parallel to the direction of flow; (a) Cosine weighted image (b) Sine weighted image. The image resolution is 3 mm with a 1 cm slice thickness. Each image is a 16 shot average.
Figure 11B:
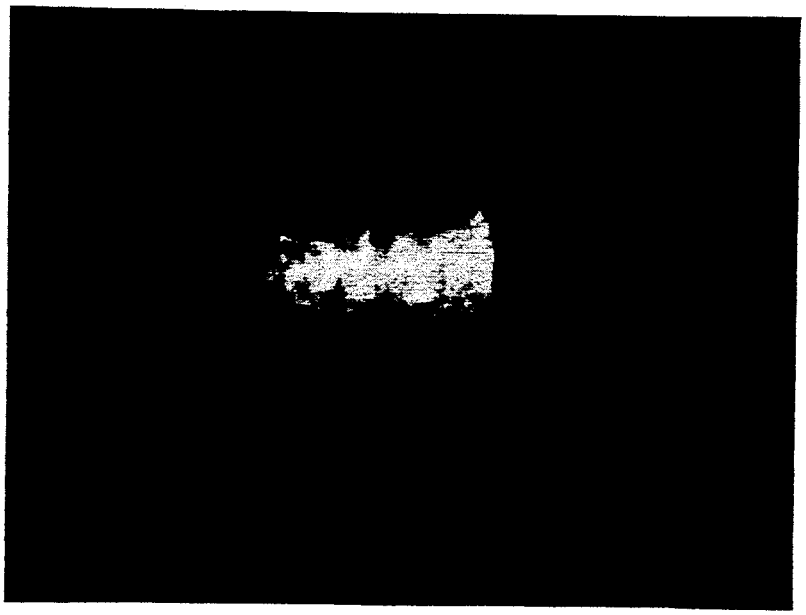
Figure 12:
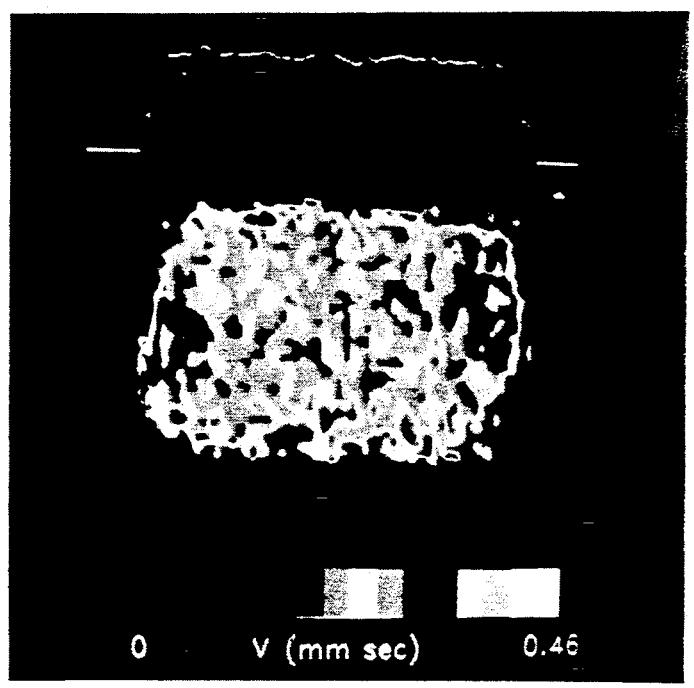
FIG. 12 shows a velocity map of data in FIG. 11. The sine weighted image is divided by the cosine weighted image and the resulting tan $\alpha$ converted to a velocity map using equation 2. $M_{stat}$ is assumed zero for all pixels; The profile at the top of the diagram represents the integrated flow at each point along the axis of the core.

FIG. 9 shows a transectional image of the Bentheimer sample. FIG. 9(a) is the cosine weighted image and 9(b) the sine weighted image. The flow rate through the sample was set at 8 ml min$^{-1}$. Using the porosity and the dimensions of the sample with the known flow rate the theoretical mean velocity through the central plane of the sample is 0.31 mm/s. The corresponding flow map for this transaxial section is shown in FIG. 10. The average velocity, taken by averaging all points in the flow map, is 0.32 mm/s. FIG. 11 shows a coronal scan of the same sample as in FIG. 10. FIGS. 11(a) and 11(b) are the cosine and sine weighted images respectively. Distilled water enters on the left at a point on the core axis. The corresponding flow map, shown in FIG. 12, shows high velocity regions at the water inlet and outlet to the sample. The flow encoding gradient for this image is applied along the horizontal direction of the image with a strength of 7.55 mT/m. The flow encoding procedure was 48 ms for the transverse image and 42 ms for the longitudinal image. Each gradient pulse duration was 1.2 ms in both cases.

The profile at the top of FIG. 12 shows the integrated flow at each point along the core axis. This remains constant along the axis as predicted by Bernoulli's theorem. At the edges of the core the profile deviates from the ideal because of the high acceleration at the inlet and outlet ports, giving rise to extra dephasing of the spin system. The average velocity through the centre of the core is 0.3 mm/s and agrees with the transectional average taken from FIG. 10. The fluid displacement which occurs during the exposure time for flow encoding, is therefore 15 μm, which is of the same order as typical pore scales in rocks.

Figure 13A:
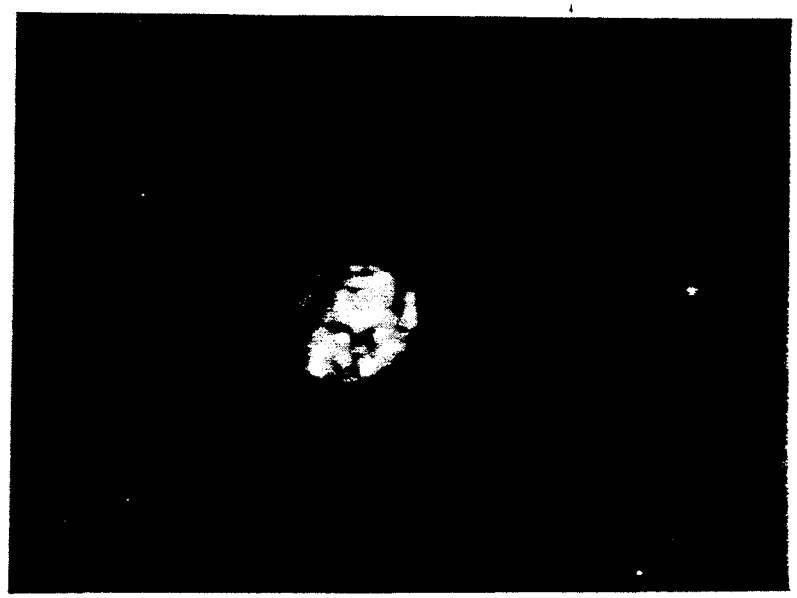
FIG. 13 shows flow encoded images of the Ninian reservoir sample taken perpendicular to the direction of flow; (a) Cosine weighted image (b) sine weighted image. The image resolution is 1 mm with a 2.5 cm slice thickness. Each image is a 16 shot average.
Figure 13B:
Figure 14:
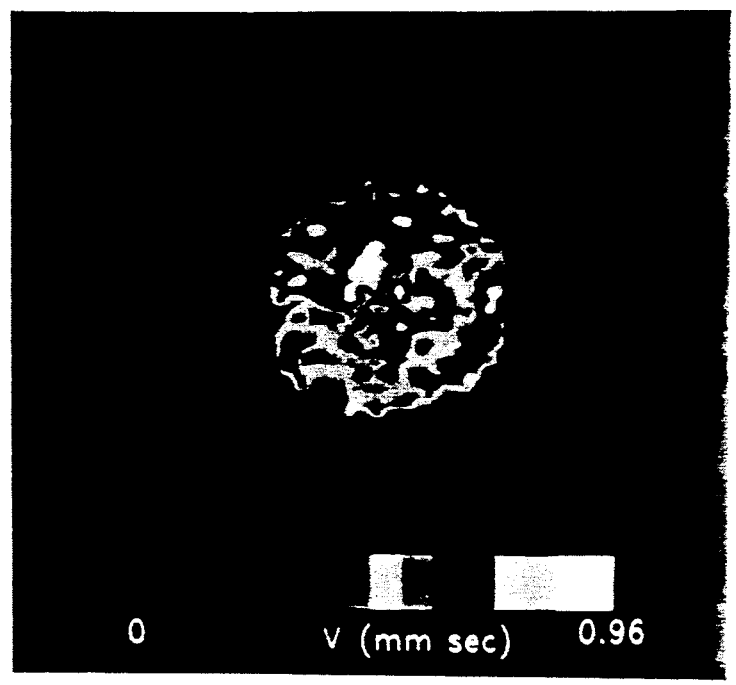
FIG. 14 shows a velocity map corresponding to the flow data of FIG. 13. The sine image is divided by the cosine image and the resulting tan $\alpha$ is converted to a velocity map using equation 2. $M_{stat}$ is assumed zero for all pixels.

The flow rate used on the Ninian sample was also 8 ml/mm, but a 3 percent brine solution was used instead of distilled water in order to preserve the clay structure. Using this flow rate and the physical dimensions of the core the theoretical mean velocity through the central plane was 0.55 mm/s. The cosine and sine results for this sample are shown in FIG. 13. These are transverse images with the flow encoding gradient applied perpendicular to the plane of the image with a strength of 3.89 mT/m and the same flow encoding parameters as used for the transectional Bentheimer image. The resulting flow map, FIG. 14, shows a region of high velocity which is indicative of some heterogeneity. All images were taken at 0.5 T with various image resolutions as mentioned in the figure captions. The Bentheimer and Ninian images were each averaged 16 times.

Figure 15:
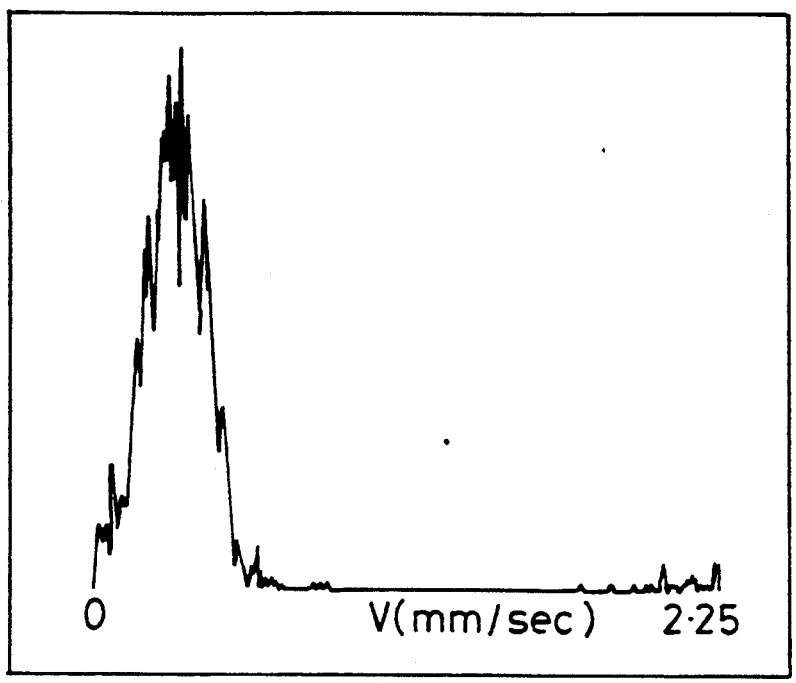
FIG. 15 shows a velocity distribution for the Bentheimer sample taken from the transverse image shown in FIG. 10.
Figure 16:
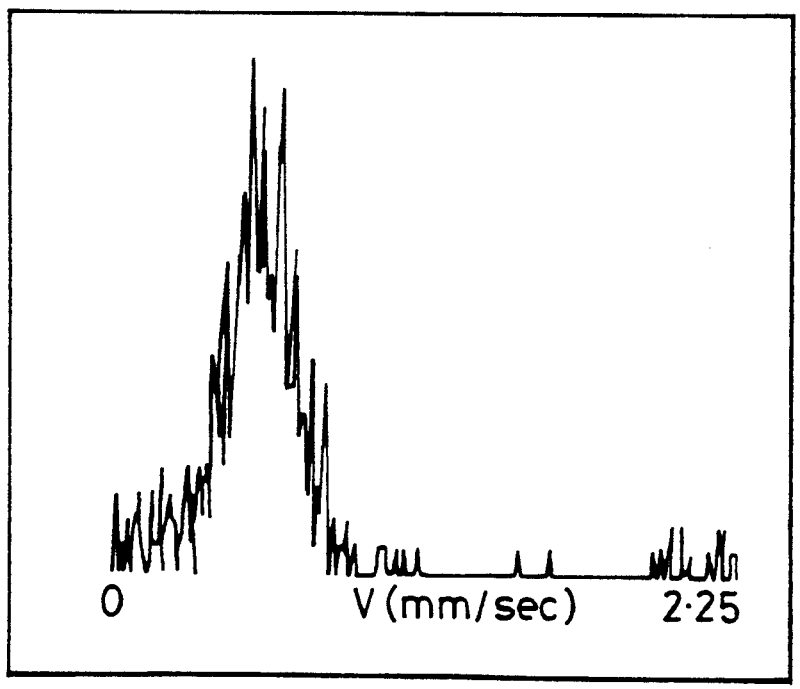
FIG. 16 shows a velocity distribution for the Ninian sample. This exhibits a broader distribution than that of the Bentheimer sample indicative of the heterogeneity of this material.

The invention therefore provides high speed imaging modality, which overcomes locally induced magnetic inhomogeneities caused by bulk susceptibility differences, has been demonstrated. A spin preparation procedure prior to this imaging sequence has been used for flow encoding. This method uses short gradient pulses in combination with 180° RF pulses to minimise the signal attenuation caused by translational diffusion. The sequence also eliminates the effect of the locally induced magnetic field gradients so that the phase accumulation arises from applied field gradients only. The net phase accumulation is therefore directly related to fluid velocity. Velocity distributions obtained from the transverse flow maps are presented in FIG. 15 and 16. The velocity distribution for the Bentheimer sample has a peak at 0.29 mm/s and for the Ninian sample it is 0.68 mm/s. However the Ninian distribution is broader than that of the Bentheimer. This is because the Ninian sample has a larger distribution of pore sizes and therefore has a larger associated distribution of velocities which is indicative of the heterogeneity of this sample.

The underlying Carr-Purcell sequence, which effectively removes internal gradients, has a sub-cycle time of $2\tau/N$. In the bentheimer sample a flow displacement of the order of 100 nm occurs during this period. The spatial scale over which the internal gradients act is likely to be of the order of microns. This suggests that the simple model of flow through a fixed gradient is likely to be a good approximation.

The diffusion attenuation term, Eq. (3), can be written in terms of the total flow encoding time $T=2\tau$ and the number of RF pulses n as $$A(G_d, T) = exp(-\tfrac{1}{3}\gamma^2 G_d^2 D(T^2/n^2)T) \qquad (8)$$

If we introduce an effective diffusion coefficient, which represents the effective diffusion during the total flow encoding time T, then we can re-write Eq. (8) as $$A(G_d, T) = exp(-\tfrac{1}{3}\gamma^2 G_d^2 D_{eff} T^3) \qquad (9)$$

where $D_{eff} = (D/2n^2)$. The effective rms displacement, $x_D$, due to diffusion is given by the expression $$x_D = \sqrt{2D_{eff}T} . \qquad (10)$$

For the Bentheimer sample with n=50, $x_D=0.2$ μm. The displacement due to flow $x_F=15$ μm. Thus the flow encoding process produced a displacement which is 50-100 times larger than that arising from diffusion. This comparison may also be used to set the lower limit for velocity measurement. For flow effects to prevail over diffusion we require $x_F > x_D$. Using Eqs. (9-10) the velocity measured, v, must fulfil the following condition $$v > \sqrt{(D/n^3 \tau_p)} \qquad (11)$$

where $\tau_p$ is the inter pulse delay and D is the diffusion coefficient of water.

These initial results demonstrate a high speed technique for flow measurement which is suitable for fluid flow studies in porous media as found in oil reservoirs. It is currently the only technique for quantitative spatial flow measurements of fluid motion inside porous solids. Although these first sandstone results represent an average of 16 images, it is anticipated that improvements in signal-to-noise ratio will make single single-shot real-time monitoring of fluid dynamics in rock achievable. This will be of interest in observing transient phenomena and the approach to the steady state within porous solids. This approach will also be useful for observing multiphase flow experiments where, for example, oil is replaced by water or vice versa and will give full quantitative high speed information of both phases.

Transport Property Mapping

In the present invention spatial velocity maps within porous media have been obtained. The oil industry is of course interested in determining hydraulic permeability of a core sample, which is a measure of its ability to sustain fluid flow under an applied pressure gradient. The permeability is defined from Darcey's law:

$$Q = k\frac{A}{\mu} \Delta P/\Delta L \qquad (12)$$

where k is permeability. Q=VA so it is a simple matter to convert the velocity map to a permeability map using the above equation.

Diffusion and resistivity are also important transport properties in determining the characteristics of an oil core. This helps the oil companies determine the amount of hydrocarbon reserves and the producibility of these reserves. A very similar technique to the present invention was reported in Jnl Mag Res, 37,75-91 1980 by Karlicek et al, which was used to determine the diffusion coefficient of a sample (not necessarily oil cores) in the presence of a large background gradient. This technique is known as the Alternating Pulse Field Gradient (APFG). The flow encoding technique could also be used to map diffusion in samples with large local gradients caused by the bulk susceptibility differences. In this technique, the effect of the local gradients is made very small so that the diffusion attenuation term from only the applied gradient makes a significant contribution. A slight modification to APFG is proposed to obtain diffusion and local gradient maps. Basically three experiments are required: one with the applied gradients in an APFG sequence, then one with no applied gradients and a final experiment with the gradient pulses applied only in a standard Carr Purrcell mode. In the first experiment the attenuation due to diffusion at the fifth echo will be (see Karlicek's paper):

$$A = A_0 \exp - \frac{2}{3} \gamma^2 D \tau^3 (5G_0^2 + 64G_A^2) \quad (13a)$$

and in the second experiment will be $$A = A_0 \exp - \frac{2}{3} \gamma^2 D \tau^3 (5G_0)^2 \quad (13b)$$

and in the final experiment the attenuation is given by $$A = A_0 \exp - \frac{2}{3} \gamma^2 D \tau^3 5 (G_0 + G_A)^2 \quad (13c)$$

There are three equations with three unknowns namely $D, G_0$ and $A_0$ although $A_0$ is not really of interest, it is therefore straight forward to solve for D and $G_0$.

The velocity mapping approach may also be used to map the local gradients, however in this case all three components may be calculated and not just the magnitude of $G_0$. This is a significant advantage over the APFG sequence. The resistivity factor, F, may be obtained from the diffusion via the equation $F = D_0/D$, where $D_0$ is the bulk diffusion coefficient and $D'$ is the measured diffusion in the porous media.

We claim:

1. A method for measuring fluid transport properties of fluid flowing through a porous medium by NMR imaging comprising the following steps:
    (a) subjecting flowing spins of the fluid within the medium to a preliminary flow phase comprising a sequence of radio frequency pulses including a sequence of spin inversion pulses sandwiched between a pair of 90° pulses, the first 90° pulse produces a transverse magnetisation component which forms a series of spin echoes under the action of the spin inversion pulses and in which the second 90° pulse restores the x or y component of spin magnetisation remaining at the end of the sequence,
    (b) applying to the medium simultaneously between the pair of 90° pulses a sequence of N bipolar interdigitated flow encoding gradient pulses,
    (c) applying to the fluid flowing through the medium a signal spin phase scrambling gradient which destroys unwanted signal components following the sequence of N bipolar integrated flow encoding gradient pulses, and
    (d) subjecting the fluid flowing through the medium to a spin interrogation phase following the previous steps.

2. A method as claimed in claim 1 in which in the sequence of N pulses each pulse is of area A, in which the first N/2 pulses are of alternate sign followed by the second set of N/2 pulses equivalent to the first set of N/2 pulses but which are reflected in time.

3. A method as claimed in claim 1 in which the sequence of N bipolar pulses comprises the sequential application of a sequence of 4 $N_0$ interdigitated acceleration encoding gradient pulses of area $A_0$ in which the first $N_0$ pulses are of alternate sign and in which the next 2 $N_0$ pulses are of alternate sign but with their phase shifted by 180° with respect to the first $N_0$ pulses and in which the last $N_0$ pulses are of alternate sign but with phase equal to the first N pulses.

4. A method as claimed in claim 1 in which the sequence of N bipolar pulses comprises the sequential application of a sequence of $N_1 + N_2 + N_3$ interdigitated velocity encoding gradient pulses are of alternate sign in which the first $N_1$ pulses have area $A_1$ the second set of $N_2$ pulses have area $A_2$ and the same starting phase as the $(N_1 - 1)^{th}$ pulse, and in which the third set of pulses $N_3$ have individual areas $A_3$ and in which the starting phase is the same as the $(N_2 - 1)^{th}$ pulse.

5. A method for measuring the flow of a fluid through a porous medium by NMR imaging as claimed in claim 1 in which the spin interrogation phase is an Echo Planar Imaging sequence using 80° RF pulses.

6. A method as claimed in claim in which the spin interrogation phase is a 2 dimensional spin warp imaging sequence.

7. A method as claimed in claim 1 in which the spin interrogation phase is a 3 dimensional spin warp imaging sequence.

8. A method for measuring the flow of a fluid through a porous medium by NMR imaging as claimed in claim 1 in which sequence (b) is modified by the inclusion of velocity encoding gradient pulses of area A/2.

9. Apparatus for measuring fluid transport properties of fluid flowing through a porous medium by NMR imaging including:
    (a) means for subjecting flowing spins of the fluid within the medium to a preliminary flow phase comprising a sequence of radio frequency pulses including a sequence of spin inversion pulses sandwiched between a pair of 90° pulses, the first 90° pulse produces a transverse magnetisation component which forms a series of spin echoes under the action of the spin inversion pulses and in which the second 90° pulse restores the x or y component of spin magnetisation remaining at the end of the sequence,
    (b) means for simultaneous application between the pair of 90° pulses of a sequence of N bipolar interdigitated velocity encoded gradient pulses,
    (c) means for providing to the fluid flowing through the medium a signal spin phase scrambling gradient which destroys unwanted signal components, following the sequences of pulses, and
    (d) means for generating a spin interrogation phase.

10. Apparatus as claimed in claim 9 in which in the sequence of N bipolar pulses each pulse is of area A and in which the first N/2 pulses are of alternate sign followed by the second set of N/2 pulses equivalent to the first set of N/2 pulses but which are reflected in time.

11. Apparatus as claimed in claim 9 in which the sequence of N bipolar pulses comprises the sequential application of a sequence of 4 $N_0$ interdigitated acceleration encoding gradient pulses of area $A_0$ in which the first $N_0$ pulses are of alternate sign and in which the next 2 $N_0$ pulses are of alternate sign but with their phase shifted by 180° with respect to the first $N_0$ pulses and in which the last $N_0$ pulses are of alternate sign but with phase equal to the first N pulses.

12. Apparatus as claimed in claim 9 in which the sequence of N bipolar pulses comprises the sequential application of a sequence of $N_1+N_2+N_3$ interdigitated velocity encoding gradient pulses are of alternate sign in which the first $N_1$ pulses have area $A_1$ the second set of $N_2$ pulses have area $A_2$ and the same starting phase as the $(N_1-1)^{th}$ pulse, and in which the third set of pulses $N_3$ have individual areas $A_3$ and in which the starting phase is the same as the $(N_2-1)^{th}$ pulse.

13. Apparatus for measuring fluid transport through a porous medium by NMR imaging as claimed in claim 9 in which the means for generating a spin interrogation phase comprises means for generating an Echo Planar Image sequence using 180° RF pulses.

14. Apparatus as claimed in claim 9 in which the spin interrogation phase is a 2 dimensional spin warp imaging sequence.

15. Apparatus as claimed in claim 9 in which the spin interrogation phase is a 3 dimensional spin warp imaging sequence.

16. Apparatus for measuring fluid transport through a porous medium as claimed in claim 9 including means for modifying sequence (b) to include velocity encoded pulses of area A/2.

* * * * *